(12) United States Patent
Hong (10) Patent No.: US 7,052,807 B2
(45) Date of Patent: May 30, 2006

(54) PHOTO MASK AND METHOD OF MANUFACTURING THE SAME, AND METHOD OF FORMING PHOTOSENSITIVE FILM PATTERN OF USING THE PHOTO MASK

(75) Inventor: Ji Suk Hong, Soowon-shi (KR)

(73) Assignee: Hynix Semiconductor Inc., Ichon (KR)

( * ) Notice: Subject to any disclaimer, the term of this patent is extended or adjusted under 35 U.S.C. 154(b) by 161 days.

(21) Appl. No.: 10/310,868

(22) Filed: Dec. 6, 2002

(65) Prior Publication Data
US 2003/0235765 A1  Dec. 25, 2003

(30) Foreign Application Priority Data
Jun. 19, 2002  (KR) ............. 10-2002-0034329

(51) Int. Cl.
*G01F 9/00* (2006.01)
(52) U.S. Cl. ........................................... 430/5
(58) Field of Classification Search ............ 430/5
See application file for complete search history.

(56) References Cited

U.S. PATENT DOCUMENTS 5,403,682 A * 4/1995 Lin ............................ 430/5
5,455,131 A * 10/1995 Kang et al. ................. 430/5

FOREIGN PATENT DOCUMENTS

KR  2002-2015  1/2002
KR  2002-2947  1/2002

* cited by examiner

*Primary Examiner*—S. Rosasco
(74) *Attorney, Agent, or Firm*—Mayer, Brown, Rowe & Maw LLP

(57) ABSTRACT

The present invention relates to a photo mask and a method of manufacturing the same, and a method of forming a photosensitive film pattern using the photo mask. A photo mask pattern having an exposure region, a phase-inverse region and a photosensitive region is provided. The predetermined size and shape of the patterns on the photo mask are formed. Through this manner, distortions of the photosensitive film pattern upon development are compensated and a target photosensitive film pattern can be more accurately acquired. Furthermore, the depth of focus of a photolithography process can be increased.

19 Claims, 8 Drawing Sheets

PHOTO MASK AND METHOD OF MANUFACTURING THE SAME, AND METHOD OF FORMING PHOTOSENSITIVE FILM PATTERN OF USING THE PHOTO MASK

BACKGROUND OF THE INVENTION

1. Field of the Invention

The invention relates generally to a photo mask and a method of manufacturing the same, and a method of forming a photosensitive film pattern using the photo mask. More particularly, the invention relates to a photo mask and a method of manufacturing the same, and a method of forming a photosensitive film pattern using the photo mask, in such a manner that target photo mask pattern and photosensitive film patterns can be formed more accurately by changing a photo mask pattern.

2. Description of the Prior Art

In the manufacture process of semiconductor devices, the contact holes or various patterns are usually formed, through the photolithography process. The procedure of the photolithography process is as follows, as well known in the art. A photosensitive film pattern is formed through application of a photosensitive film and exposure and development of the photosensitive film using a photo mask, and an etch process is then performed using the photosensitive film pattern as a mask to form a target pattern. In this case, a non-transparent chrome pattern formed in the transparent substrate such as a quartz substrate, etc. is generally used as the photo mask (i.e., reticle).

Figure 1A:
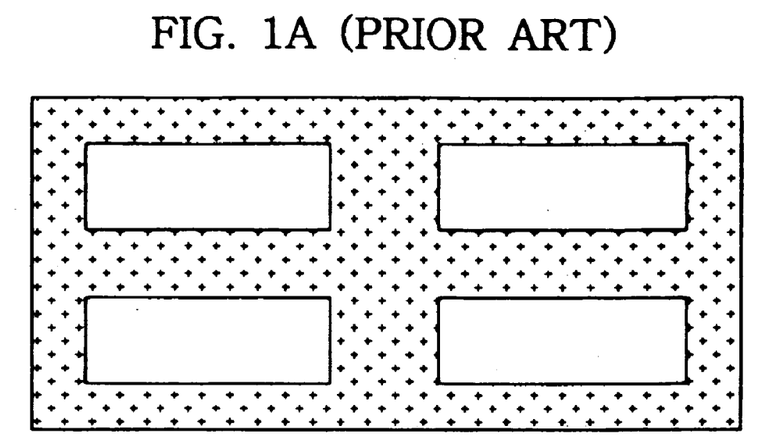
FIG. 1A is a layout diagram of a conventional photo mask in which a capacitor of a DRAM (dynamic random access memory) device will be formed.
Figure 1B:
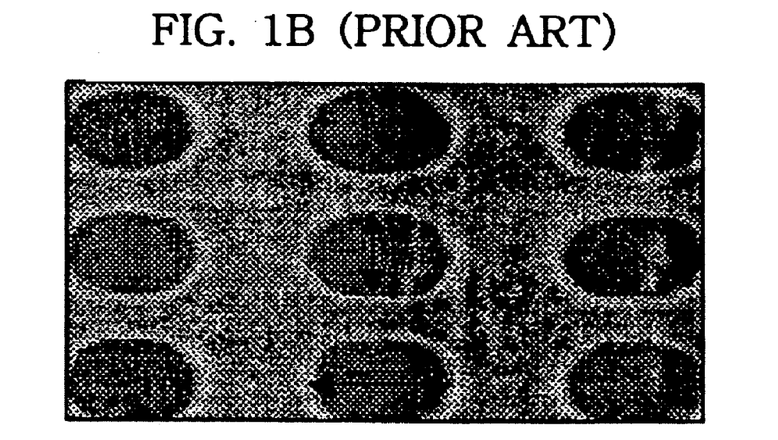
FIG. 1B is a SEM (scanning electron microscope) photography of a photosensitive film pattern formed on a substrate using the mask in FIG. 1A.
Figure 1C:
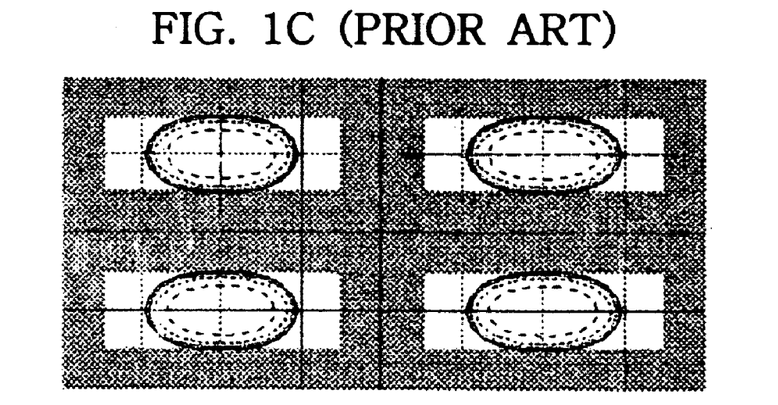
FIG. 1C is a layout diagram of the photosensitive film pattern simulated using the mask in FIG. 1A.

FIG. 1A is a layout diagram of a conventional photo mask in which a capacitor of a DRAM (dynamic random access memory) device will be formed, FIG. 1B is a SEM (scanning electron microscope) photography of a photosensitive film pattern formed on a substrate using the mask in FIG. 1A, and FIG. 1C is a layout diagram of the photosensitive film pattern simulated using the mask in FIG. 1A.

Referring to FIG. 1A~FIG. 1C, the photosensitive film pattern formed on the wafer by the mentioned photolithography process is distorted, compared to the shape of the design. In other words, in order to make the capacitor pattern of a rectangular shape, the photo mask pattern is designed to have the rectangular shape as shown in FIG. 1A. If the exposure and development processes are performed using the mask pattern, the photosensitive film pattern of an elliptical shape, not the rectangular shape, is formed on the wafer as shown in FIG. 1B.

This distortion is caused by an optical proximity effect that light passing the photo mask pattern causes interference between neighboring patterns in the photolithography process. There is a trend that distortion owing to the optical proximity effect becomes more important, as the size of the pattern to be resolved is smaller than the wavelength of the light source.

Due to this cause, there is a problem the critical dimension of the capacitor pattern formed on the wafer becomes smaller than the critical dimension of a desired pattern. Especially, in case of a long side axis direction in the elliptical circle, the critical dimension of the capacitor pattern is significantly reduced than a target critical dimension as shown FIG. 1C.

In order to solve the above problems, an optical proximity effect correction (hereinafter called 'OPC') method in which the length of the long side axis is in advance lengthened so that a desired size of the long side axis can be formed and an assistant pattern of an adequate shape is added, has been developed.

Figure 2A:
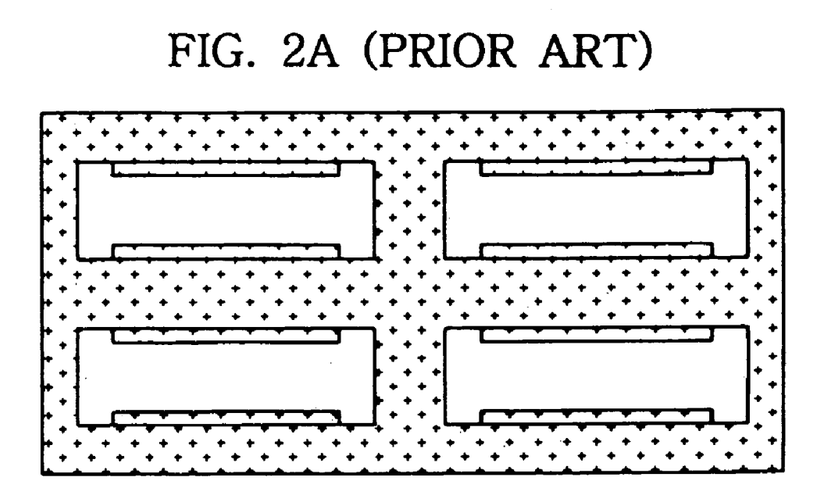
FIG. 2A is a layout diagram of the conventional photo mask pattern in which the capacitor to which OPC is applied will be formed.
Figure 2B:
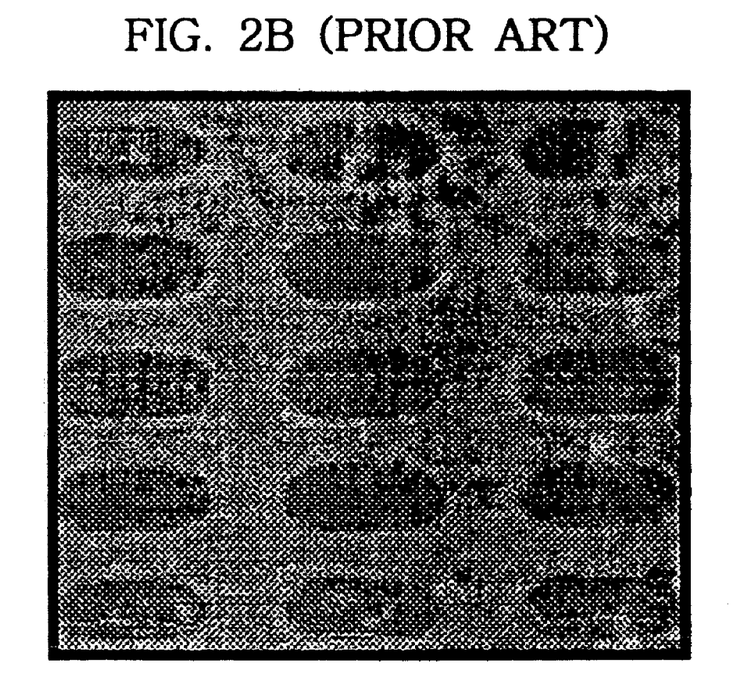
FIG. 2B is a SEM photography of the photosensitive film pattern formed on a wafer using the mask in FIG. 2A.
Figure 2C:
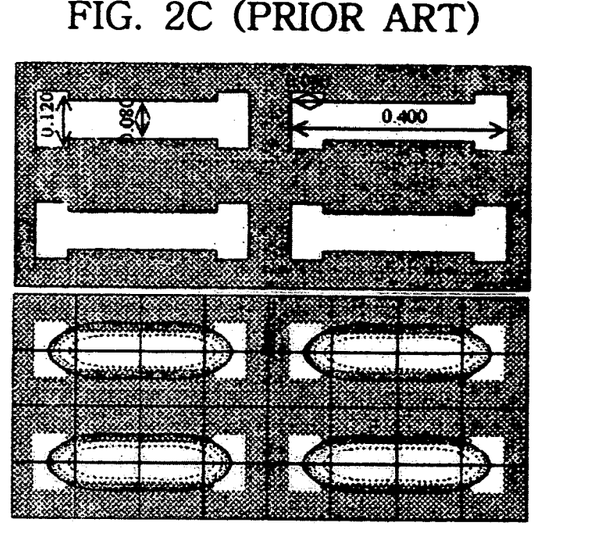
FIG. 2C is a layout diagram of the photosensitive film pattern simulated using the mask in FIG. 2A.

FIG. 2A is a layout diagram of the conventional photo mask pattern in which the capacitor to which OPC is applied will be formed, FIG. 2B is a SEM photography of the photosensitive film pattern formed on a wafer using the mask in FIG. 2A, and FIG. 2C is a layout diagram of the photosensitive film pattern simulated using the mask in FIG. 2A.

Referring to FIG. 2A~FIG. 2C, in case of designing the mask pattern for photo, the photo mask pattern is formed using the OPC method wherein the size of the long side axis is lengthened and the assistant pattern is added in the long side axis direction. Next, the exposure and development process as shown in FIG. 2B forms the photosensitive film pattern in which the capacitor will be formed on the wafer. Thereby, the problem that the long side axis is reduced is solved by some degree (compare FIG. 1B and FIG. 1C, and FIG. 2B and FIG. 2C).

Though the reduction of the long side axis is reduced is solved by some degree using the mentioned technology, the same OPC patterns could not be exactly implemented on the photo mask. (By lengthening the length of the long side axis and adding an assistant pattern of an adequate shape). In other words, there is a problem that a uniform photo mask pattern could not be formed as the size of the assistant pattern becomes smaller than the resolution limit of the lighting equipment used when the photo mask pattern is fabricated using the OPC method since the design rule is reduced. Due to this, not only the regularity with the pattern formed on the photo mask is lowered but also the pattern is patterned in asymmetric shape right and left on the single pattern.

In addition, examining the photosensitive film pattern formed by the photography process using the photo mask (i.e., reticle), a phenomenon that the photosensitive film pattern is distorted is compensated for by some degree. However, the regularity between the photosensitive film patterns is lowered. Thereby, there is a problem that the characteristic of the semiconductor device is degraded since the regularity between the devices formed using the above photosensitive film pattern is lowered.

SUMMARY OF THE INVENTION

The present invention is contrived to solve the above problems and an object of the present invention is to provide a photo mask capable of uniformly forming the photo mask and a photosensitive film pattern formed using the mask, and forming a target size of a photosensitive film pattern, in such a way that the photo mask is formed using a light-shielding film and a phase-reverse film and the mask pattern is changed.

In order to accomplish the above object, the photo mask having an exposure region of an isolated pattern shape according to the present invention, is characterized in that it comprises a light-shielding film formed at the entire the short side peripheral region and given portions of a long side peripheral region in the exposure region, and a phase-reverse film formed at the entire the long side peripheral region except for the given portions where the light-shielding film is formed.

Further, a method of manufacturing a photo mask in which a phase-reverse film and a light-shielding film are located at an exposure region of an isolated pattern shape and a long side peripheral region of the exposure region, is characterized in that it comprises the steps of sequentially forming the phase-reverse film and the light-shielding film on a transparent pattern, forming a first photosensitive film pattern for patterning the exposure region, on a light-shielding film, removing the light-shielding film and the phase-reverse film using the first photosensitive film pattern to form the exposure region of the isolated pattern shape, removing the first photosensitive film pattern and then forming a second photosensitive film pattern in order to leave the light-shielding film at the entire the short side peripheral region of the exposure region and given portions of the long side peripheral region, etching the light-shielding film using the second photosensitive film pattern, and removing the second photosensitive film pattern.

Also, a method of manufacturing a photo mask in which a phase-reverse film and a light-shielding film are located at an exposure region of an isolated pattern shape and a long side peripheral region of the exposure region, is characterized in that it comprises the steps of sequentially forming a phase-reverse film and a light-shielding film on a transparent pattern, forming, on the light-shielding film, a first photosensitive film pattern for removing the light-shielding film formed on the exposure region and a long side peripheral region of the exposure region, patterning the light-shielding film using the first photosensitive film pattern, removing the first photosensitive film pattern and then forming a second photosensitive film pattern for removing the phase-reverse film of the exposure region, removing the phase-reverse film using the second photosensitive film pattern, thus forming the exposure region, and removing the second photosensitive film pattern.

Also, the method of forming the photosensitive film pattern is characterized in that it comprises the steps of covering a photosensitive film on a base layer and then performing a baking process, performing an exposure process using the photo mask, and performing a development process to remove a portion of the photosensitive film.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings, in which like reference numerals are used to identify the same or similar parts.

Figure 3A:
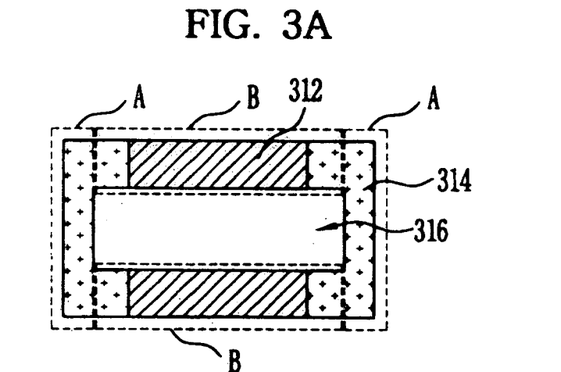
FIG. 3A~FIG. 3C are layout diagrams of single photo mask patterns according to a preferred embodiment of the present invention.
Figure 3B:
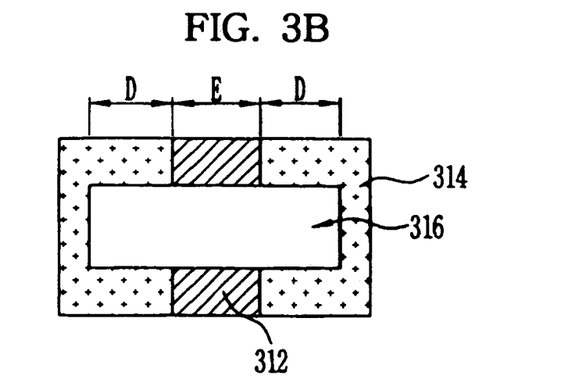
Figure 3C:
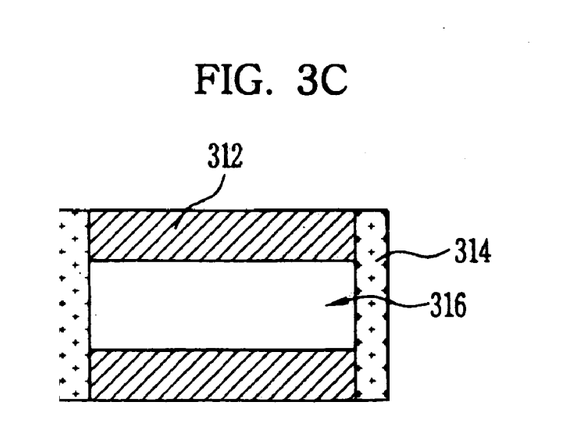

FIG. 3A~FIG. 3C are layout diagrams of individual photo mask patterns according to a preferred embodiment of the present invention.

Referring to FIG. 3A~FIG. 3C, phase-reverse films 312 for generating an interference effect of light are positioned at some of a peripheral region of an exposure region 316 of an isolated pattern shape. Light-shielding films 314 are formed at remaining regions where the phase-reverse films 312 are not formed.

For convenience of explanation, although the figures show a case where the exposure region 316 of the isolated pattern is a rectangular shape, it should be noted that the shape of the isolated pattern is not limited to the rectangular shape. In other words, the shape of the isolated pattern may be a pattern shape for manufacturing the semiconductor devices having a closed curve shape such as polygonal, elliptical shape, etc. In these cases, a rectangle circumscribing the isolated pattern is drawn, wherein a longer side of the rectangle is defined as 'long side' and a shorter side is defined as 'short side'.

Meanwhile, a given region (see 'A' region in FIG. 3A) adjacent to the short side of the exposure region of the isolated pattern is defined as 'the short side peripheral region' and a given region (see 'B' region in FIG. 3A) adjacent to the long side of the exposure region of the isolated pattern is defined 'the long side peripheral region'.

Referring to FIG. 3A~FIG. 3C, the light-shielding films 314 for preventing penetration of light are formed in entire short side peripheral region and a portion of the long side peripheral region from an edge of exposure region 316. The phase-reverse films 312 for generating an interference effect of light are formed at some of the long side peripheral region where the light-shielding films 314 are not formed.

The light-shielding film 314 may be formed using a chrome film, etc. but not limited to it. The light-shielding film 314 may be formed using a film through which light does not transmit. Also, the phase-reverse film 312 may be formed using all the films that can invert the phase of incident light. The transmissivity of the phase-reverse film 312 is approximately 5~30%.

The short side of the mentioned exposure region 316 is patterned to have a width of about 0.08~0.25 µm and the long side of the mentioned exposure region 316 is patterned to have a width so that neighboring exposure regions 316 are not shorted each other. In the present embodiment, the length of the short side of the exposure region having the rectangular shape is patterned to have a width of 0.1~0.15 µm and the length of the short side of the exposure region is patterned to have a width of 0.35~0.45 µm.

At this time, the transmission range of light that is phase-inverted in the long side direction can be controlled by the light-shielding film 314 formed in the long side peripheral region. In other words, the interference effect of light generated by the phase-reverse film 312 at both end regions of the exposure region 316 can be controlled by adjusting the width of the light-shielding film 314 formed in the long side peripheral region. Also, the shape of the photosensitive film pattern that will be formed on a base layer by a photo-lithography process (to be described later) may be controlled by adjusting the interference effect of light.

In details, the phase-reverse films 312 are formed at the center (see 'E' region in FIG. 3B) on the basis of the center of the long side peripheral region and the light-shielding films 314 are formed at both sides (see 'D' region in FIG. 3B) of the long side peripheral region. At this time, the phase-reverse films 312 may be formed at the region of 10~100% of the entire the long side peripheral region and the light-shielding films 314 may be formed at the region of 0~90% of the entire long side peripheral region. Preferably, the long side peripheral region may be symmetrically extended on the basis of the long side. Also, in case that the shape of the isolated pattern is not the rectangular shape, the phase-reverse films 312 are formed corresponding to the length of 10~100% of the entire long side closed curve, on the basis of the long side length of the closed curve.

Figure 3D:
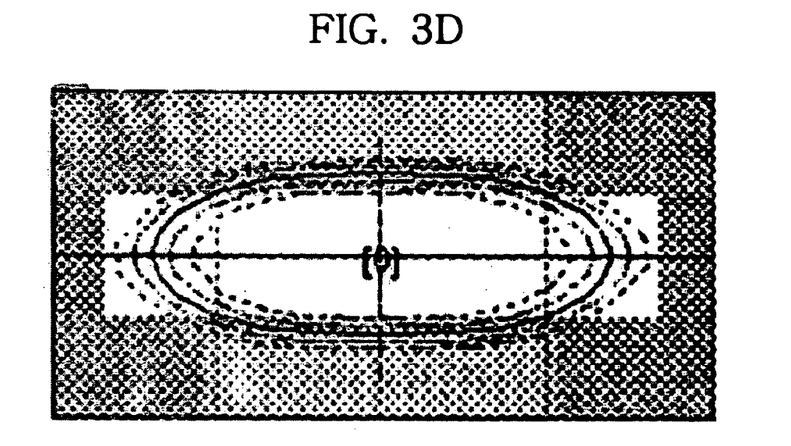
FIG. 3D~FIG. 3E show the photosensitive film patterns simulated each using the masks in FIG. 3A~FIG. 3C.
Figure 3E:
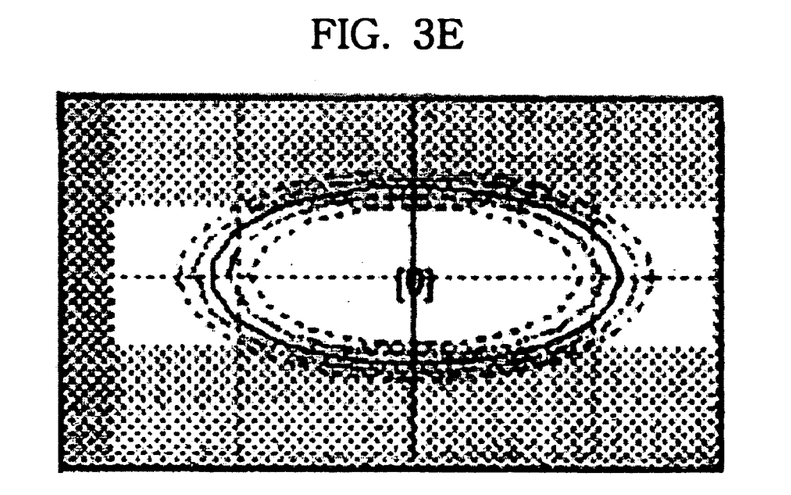

FIG. 3D~FIG. 3E are cross sectional views of the photosensitive film patterns simulated using the masks in FIG. 3A~FIG. 3C.

Referring to FIG. 3A, 3C, 3D and 3E, simulation results wherein the short side length of the photosensitive film pattern is defined 0.12 µm and the long side length is defined 0.4 µm will be below compared. Examining the simulation result (see FIG. 1C) using the conventional photo mask pattern (see FIG. 1A), it can be seen that the pattern is severely distorted in the long side direction since the long side length is patterned by 0.249 µm, which is shorter by about 0.151 µm than a target 0.4 µm. On the contrary, examining the simulation region (see FIG. 3E) using the photo mask pattern (see FIG. 3C) where the phase-reverse films 312 are formed at the entire the long side peripheral region, the long side length is patterned by 0.303 µm, which is smaller by about 0.097 µm than a target 0.4 µm. However, it can be seen that the long side length is patterned longer about 0.054 µm than conventionally 0.249 µm. Also, examining the simulation result (see FIG. 3D) using the photo mask pattern (see FIG. 3A) where the phase-reverse film and the light-shielding film are formed at the long side peripheral region, the long side length is patterned by 0.366 µm, which is shorter by about 0.034 µm than a target 0.4 µm. However, it can be seen that the length of the long side is patterned longer by about 0.117 µm than 0.249 µm of conventional case.

As in the above results, tern where only the phase-reverse film is formed at the long side peripheral region than the conventional photo mask pattern is used, the range of error in response to a target photosensitive film pattern can be reduced by some degree. Also, both the phase-reverse film and the light-shielding film are formed at the long side peripheral region in the photo mask pattern, the same pattern as the photosensitive film pattern can be formed since the range of error with a target photosensitive film pattern is reduced additionally. If a preferred pattern region is defined by these simulations, the phase-reverse film may be formed at the region of 50~70% and the light-shielding film may be formed at the region of 30~50%, in the long side peripheral region.

Therefore, a phenomenon that the critical dimension of the photosensitive film pattern formed on the conventional base layer is reduced in the long side direction can be sufficiently compensated. Therefore, the photosensitive film pattern having the critical dimension close to the critical dimension of a target photosensitive film pattern upon the design can be formed. Furthermore, an OPC method in which an assistant pattern of an adequate shape is added to the photo mask pattern mentioned above may be used.

A shape wherein the exposure regions of the isolated pattern shape are spaced in equal distance and are repeatedly arrayed will be described by reference to FIG. 4A, FIG. 4B, FIG. 5A and FIG. 5B.

Figure 4A:
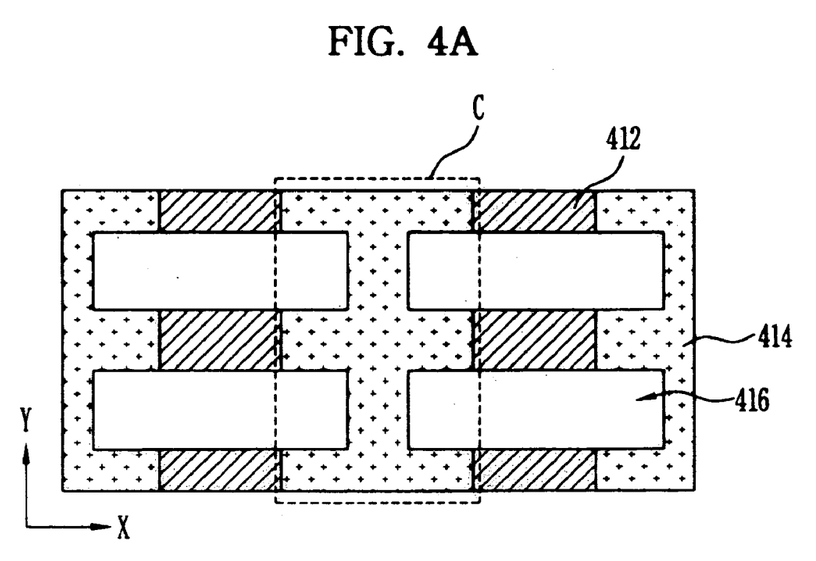
FIG. 4A and FIG. 5A are layout diagrams of photo mask pattern arrays according to a preferred embodiment of the present invention.
Figure 4B:
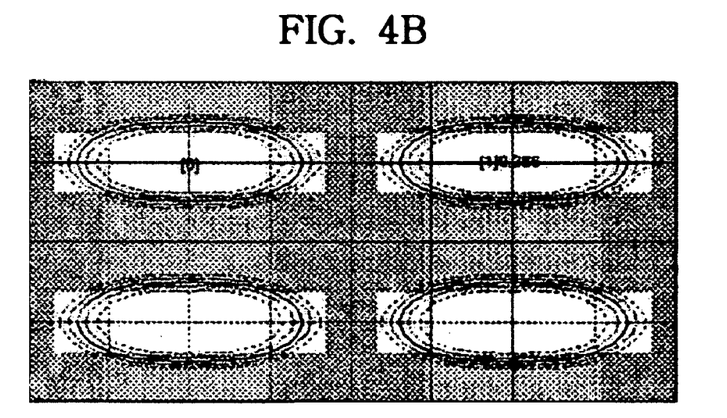
FIG. 4B and FIG. 5B are layout diagrams of the photosensitive film pattern arrays simulated each using the masks in FIG. 4A and FIG. 5A.
Figure 5A:
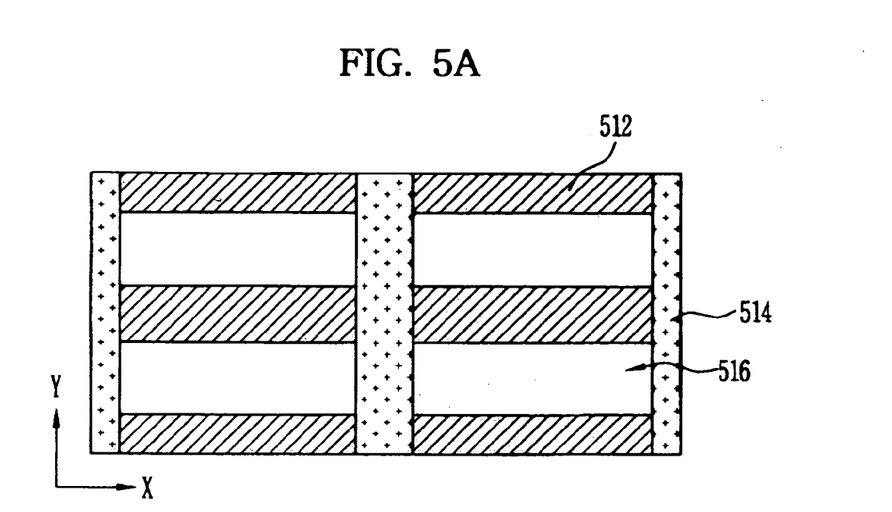
Figure 5B:
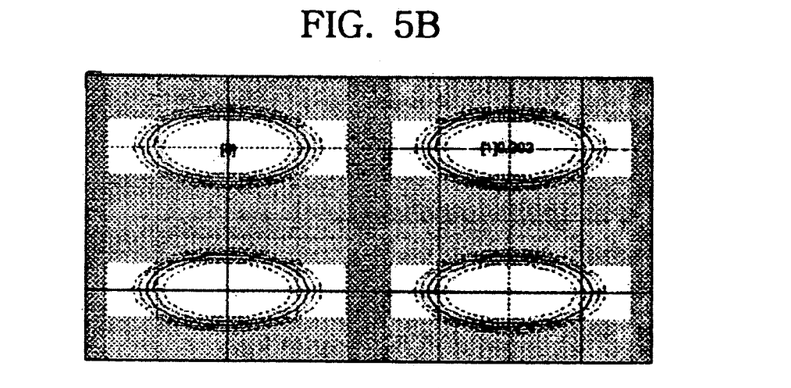

FIG. 4A and FIG. 5A are layout diagrams of the photo mask pattern arrays according to a preferred embodiment of the present invention, and FIG. 4B and FIG. 5B are layout diagrams of the photosensitive film pattern arrays simulated each using the masks in FIG. 4A and FIG. 5A, respectively.

A case of the mask pattern array where the phase-reverse film is located at some of the long side peripheral region will be first described.

This case corresponds to the mask pattern array having the exposure region of the rectangular shape in order to form the capacitor of the DRAM device.

Referring to FIG. 4A and FIG. 4B, light-shielding films 414 of a shape '±' (see 'C' in FIG. 4A) that are spaced in equal distance in the X axis direction are formed at the transparent pattern, and a plurality of phase-reverse films 412 are formed in equal distance in the Y axis, thus defining a plurality of exposure regions 416 of an isolated pattern shape. At this time, the phase-reverse films 412 are formed between protruded portions of the shape '±' and the exposure regions 412 are formed between recessed portions of the shape '±'. In this array, the width of the recessed light-shielding films 414 has a thickness by which neighboring two patterns are not connected with the light-shielding films 414 intervened on the basis of the X axis.

The above mentioned transparent pattern may be formed using a quartz substrate or a crystal substrate but not limited it. The transparent pattern may be formed using a substrate having an outstanding transmissivity.

Next, a case where the entire the long side peripheral region is formed using the phase-reverse film will be described.

Referring to FIG. 5A and FIG. 5B, a plurality of light-shielding films 514 of a belt shape that are spaced in equal distance in the X axis direction are formed in the transparent pattern, and a plurality of equally spaced phase-reverse films 512 are formed in the Y axis direction, thereby forming exposure regions 516 of the isolated pattern shape. In other words, the light-shielding films 514 are located at the sidewall of the X axis of the exposure regions 516 and the phase-reverse films 512 are located at the sidewall of the Y axis. At this time, the width of the light-shielding film 514 is formed to have a thickness by which neighboring two patterns are not connected with the light-shielding films 514 intervened.

FIG. 4B and FIG. 5B of the simulation results, when the photosensitive film pattern are formed using the photo masks having the above patterns, and FIG. 1C and FIG. 2C of the conventional simulation results will be compared. It is founded that the photosensitive film pattern of the present invention is constantly formed on the base layer in an elliptical shape in which the long side direction is sufficiently compensated, without distortion of the pattern.

Figure 6A:
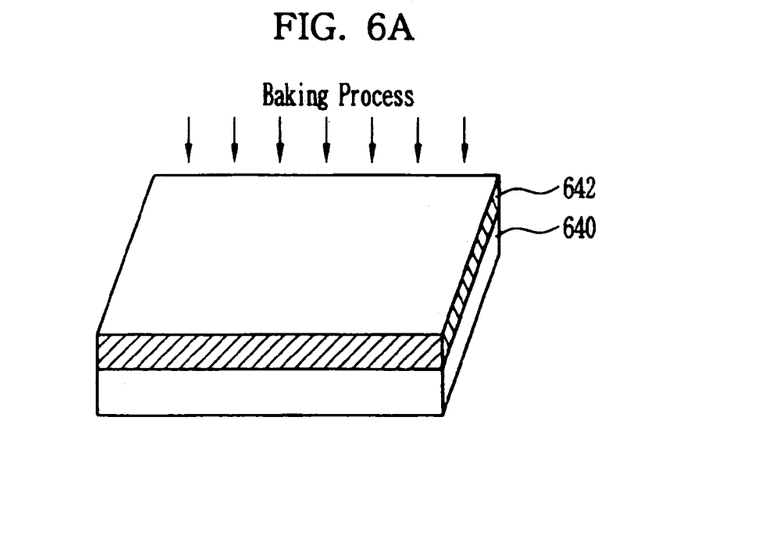
FIG. 6A FIG. 6C are cross sectional views of the photo mask patterns for explaining a photography process using the photo mask pattern according to the present invention.
Figure 6B:
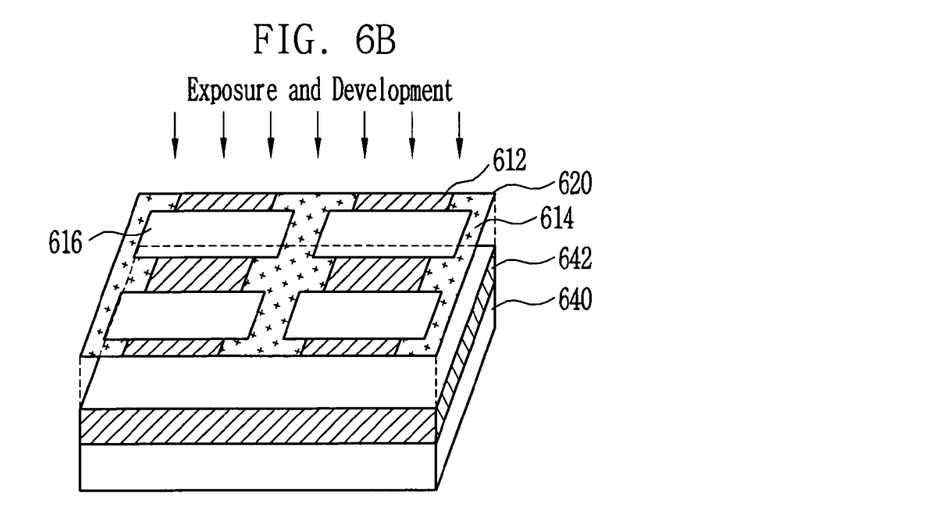
Figure 6C:
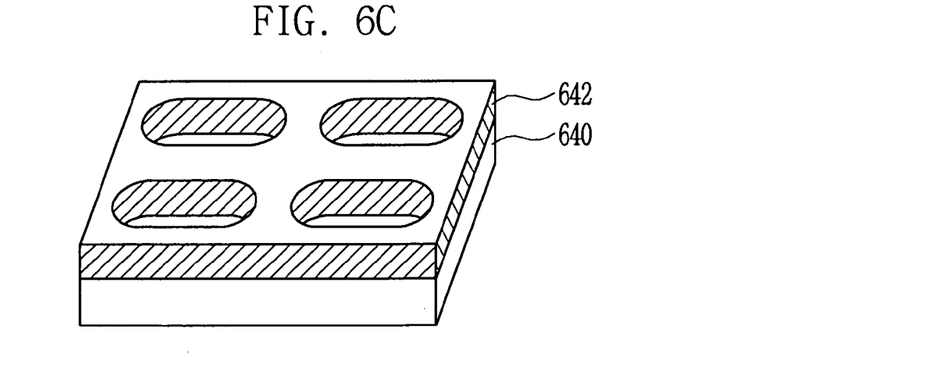

FIG. 6A~FIG. 6C are cross sectional views of the photo mask patterns for explaining a photography process using the photo mask pattern according to the present invention. to the present invention.

Referring to FIG. 6A, a photosensitive film 642 having a thickness of 3000~15000 Å is formed on a base layer 640 using any one of chemical amplified resist, dissolution inhibited resist and chain scission resist. The term 'base layer' of the present invention may be an any structure layer formed using one of an insulating layer, a conductive layer and a semiconductor layer but not limited to them. Instead, the base layer may indicate all the layers on which the photosensitive film can be applied. The above mentioned photosensitive film is not specially limited but may indicate all the photosensitive films the property of which is changed by light.

In order to maintain the regularity of the photosensitive film 642 constantly, a baking process is performed using any one of a hot plate mode, an oven mode and a vacuum oven mode. The baking process is not limited to them. Instead, the baking process may indicate a process capable of maintaining the regularity of the photosensitive film 642 and removing volatile materials contained in the photosensitive film 642. At this time, when the oven mode is used, the material of the cover of the oven may include at least one of lead, titanium, tantalum, stannum, platinum, barium and palladium, which have a low thermal conductivity.

Referring to FIG. 6B and FIG. 6C, an exposure process and a development process, using the photo mask 620, where the phase-reverse films 612, are performed in the long side peripheral region of the exposure regions 616 of the rectangular shape, thus forming the photosensitive film pattern 642.

In details, during the exposure process the photosensitive film 642 do not react with light, since the light does not transmit through the region where the light-shielding films 614 of the photo mask 620 are formed. Meanwhile, light transmits through the exposure region 616, and the light and the photosensitive film 642 react to each other. At this time, the phase of light is inverted by the phase-reverse films 612 around the exposure region 616 and the inverted light is incident so as to cause the interference effect of light. Therefore, the interference effect of light is generated in the long side direction, because of the phase-reverse films 612 located at the long side peripheral region of the exposure region 616 of the rectangular shape. The region of the photosensitive film 642 that reacts to light is widened in the long side direction. Also, the interference effect of light is generated only at the central portion of the exposure region 616 and the interference effect of light at both ends of the exposure region 616 is inhibited by the light-shielding film 614 so that in the region of the photosensitive film 642 that react with light can be maximized in the long side direction. Upon the exposure process, light of at least one of an electron beam source having a wavelength of 190~370 nm, an X-ray and an ion rays may be used, which is not limited to them. Instead, all of lights that can react the photosensitive film 642 may be used.

Figure 7A:
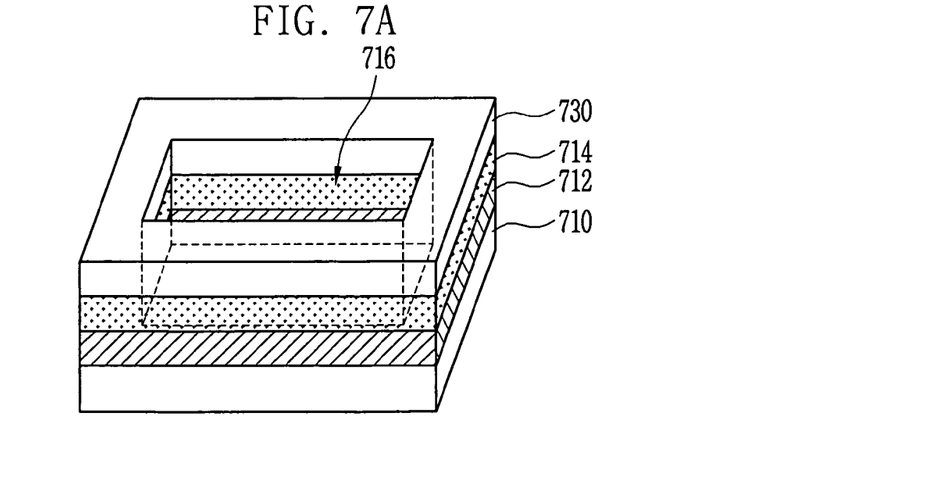
FIG. 7A~FIG. 7C are cross sectional views of the photo mask patterns for explaining a method of manufacturing a reticle according to the present invention.
Figure 7B:
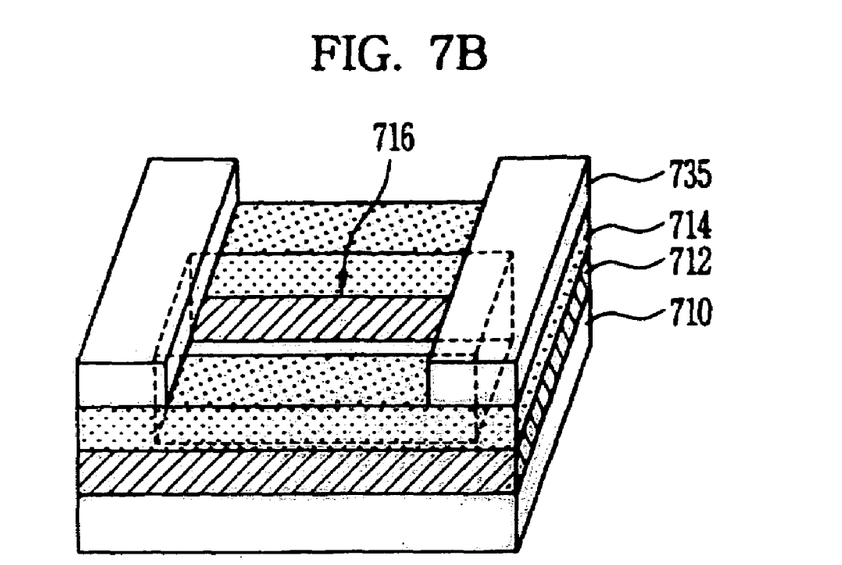
Figure 7C:
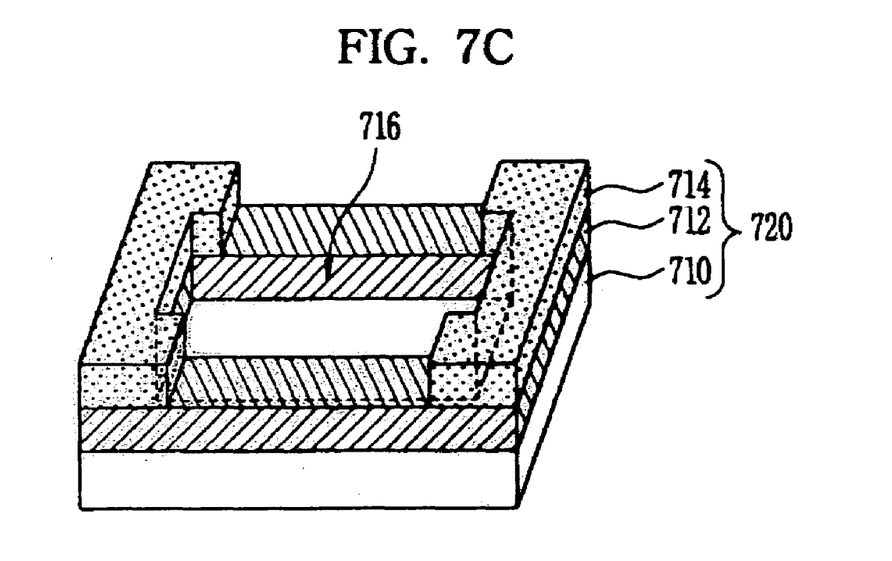

FIG. 7A~FIG. 7C are cross sectional views of the photo mask patterns for explaining a method of manufacturing a reticle according to the present invention.

Referring to FIG. 7A, a phase-reverse film 712, a light-shielding film 714 and a first photosensitive film are covered on a transparent substrate 710. A photo-lithography process is then performed to form a first photosensitive Next, an etch process using the first photosensitive film pattern 730 as an etch mask is performed to expose the transparent pattern 710, thus defining the exposure region 716 of an isolated pattern shape.

Referring to FIG. 7B and FIG. 7C, the first photosensitive film pattern 730 is removed. A second photosensitive film is then covered on the entire structure. Next, a lighting process is performed to form a second photosensitive film pattern 735. An etch process using the second photosensitive film pattern 735 as an etch mask is performed to remove the light-shielding film 714, thus exposing the phase-reverse film 712. At this time, the second photosensitive film pattern 735 exposes the exposure region 716 and also exposes the long side peripheral region of the exposure region 716. In concrete, 10~100% of the long side peripheral region is exposed. Thereby, all the exposure regions 716 are exposed by the second photosensitive film pattern 735, so that the long side peripheral region of the exposure region 716 is simultaneously exposed or the central portion of the exposure region 716 is exposed. Thereby, only a portion of the long side peripheral region of the exposure region 716 is simultaneously exposed. Next, the second photosensitive film pattern 735 is removed to form a photo mask 720.

The method of manufacturing another reticle will be described.

a phase-reverse film, a light-shielding film and a first photosensitive film are covered on a transparent substrate. A photolithography process is then performed to form a first photosensitive film pattern. At this time, the light-shielding film at a region, where an exposure region is defined, and a light-shielding film at a region, where an exposure region is defined, and a region, where the phase-reverse film is defined, is exposed by the first photosensitive film pattern. In concrete, the first photosensitive film in the region except for some of the short side peripheral region and the long side peripheral region in the exposure region defined to have an isolated pattern is removed. At this time, the first photosensitive film equal to about 0~90% of the long side peripheral region is exposed. Next, an etch process using the first photosensitive film pattern as an etch mask is performed to expose the phase-reverse film, so that the light-shielding film is patterned.

After the first photosensitive film pattern is removed, a second photosensitive film is covered on the entire structure. A photo-lithography process is then performed to a second photosensitive film pattern. At this time, the second photosensitive film pattern is patterned to have an isolated pattern shape so that the phase-reverse film is patterned to expose the exposure region of the isolated pattern shape. (see the pattern shown in FIG. 7A). Next, the phase-reverse film is removed by an etch process using the second photosensitive film pattern as an etch mask, thus exposing the exposure region of the isolated pattern shape. The second photosensitive film pattern is removed to form a photo mask. Thereby, the phase-reverse film is formed at the region of 10~100% of the long side peripheral region in the exposure region and the light-shielding film is formed at the region of 0~90% of the long side peripheral region in the exposure region.

As mentioned above, according to the present invention, the photo mask pattern having the exposure region, the phase-inverse region and the photosensitive region is changed. Therefore, the present invention has an advantageous effect that it can constantly form the size and shape of the patterns on the photo mask.

Further, the photosensitive film pattern is formed on the base layer using the mask pattern for photo. Thus, the present invention has advantageous effects that it can sufficiently compensate for distortion of the photosensitive film pattern and form a target photosensitive film pattern.

Also, in case that a photography process is performed, the depth of focus being a representative standard of the degree of freedom in the process.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A photo mask having an exposure region of an isolated pattern shape, comprising:
   a light-shielding film formed at the entire short side peripheral region and at the region of below about 90% of a long side peripheral region in the exposure region; and
   a phase-reverse film formed at the entire long side peripheral region except for the predetermined portions where the light-shielding film is formed,
   wherein a width of the light-shielding film is same as that of the phase reverse film.

2. The photo mask as claimed in claim 1, wherein the phase-reverse film is formed at the region of about 10~100% of the long side peripheral region.

3. The photo mask as claimed in claim 1, wherein the light-shielding film is formed at the region of about 30~50% of the long side peripheral region, or the phase-reverse film is formed at the region of 50~70% of the long side peripheral region.

4. The photo mask as claimed in claim 1, wherein the exposure region has a rectangular shape.

5. The photo mask as claimed in claim 4, wherein the short side length of the exposure region having the rectangular shape is patterned to have a width of 0.08~0.25 µm and the long side length of the exposure region is patterned to have a width of 0.35~0.45 µm.

6. The photo mask as claimed in claim 1, wherein the exposure region is spaced and arranged in equal distance.

7. The photo mask as claimed in claim 1, wherein the phase-reverse film has a transmissivity of 5~30% and the phase of the light passed through the phase-reverse film is inverted.

8. A method of manufacturing a photo mask in which a phase-reverse film and a light-shielding film are located at an exposure region of an isolated pattern shape and a long side peripheral region of the exposure region, comprising the steps of:
   sequentially forming the phase-reverse film and the light-shielding film on a transparent pattern;
   forming a first photosensitive film pattern for patterning the exposure region, on the light-shielding film;
   removing the light-shielding film and the phase-reverse film using the first photosensitive film pattern to form the exposure region of the isolated pattern shape;
   forming a second photosensitive film pattern, after removing the first photosensitive film pattern, in order to leave the light-shielding film at the entire short side peripheral region of the exposure region and at the region of below about 90% of the long side peripheral region;
   etching the light-shielding film using the second photosensitive film pattern; and
   removing the second photosensitive film pattern.
   wherein a width of the light-shielding film is identical to that of the phase reverse film.

9. The method as claimed in claim 8, wherein the phase-reverse film is formed at the region of about 10~100% of the long side peripheral region.

10. The method as claimed in claim 8, wherein the light-shielding film is formed at the region of about 30~50% of the long side peripheral region, or the phase-reverse film is formed at the region of 50~70% of the long side peripheral region.

11. The method as claimed in claim 8, wherein the exposure region of the isolated pattern shape is rectangular.

12. The method as claimed in claim 11, wherein the short side length of the exposure region having the rectangular shape is patterned to have a width of 0.08~0.25 µm and the long side length of the exposure region is patterned to have a width of 0.35~0.45 µm.

13. The method as claimed in claim 8, wherein the phase-reverse film has a transmissivity of 5~30% and the phase of the light passed through the phase-reverse film is inverted.

14. A method of manufacturing a photo mask in which a phase-reverse film and a light-shielding film are located at an exposure region of an isolated pattern shape and a long side peripheral region of the exposure region, comprising the steps of:
   sequentially forming a phase-reverse film and a light-shielding film on a transparent pattern;
   forming, on the light-shielding film, a first photosensitive film pattern for removing the light-shielding film formed on the exposure region and a long side peripheral region of the exposure region;
   patterning the light-shielding film using the first photosensitive film pattern, thus leaving the light-shielding film at entire portions of a short side peripheral region of the exposure region and at the region of below about 90% of the long side peripheral region;
   removing the first photosensitive film pattern and then forming a second photosensitive film pattern for removing the phase-reverse film of the exposure region;
   removing the first photosensitive film pattern and then forming a second photosensitive film pattern for removing the phase-reverse film of the exposure region;
   removing the phase-reverse film using the second photosensitive film pattern, thus remaining the phase-reverse film at the entire long side peripheral region except for the predetermined potions where the light-shielding film is formed and forming the exposure region; and
   removing the second photosensitive film pattern,
   wherein a width of the light-shielding film is same as that of the phase reverse film.

15. The method as claimed in claim 14, wherein the phase-reverse film is formed at the region of about 10~100% of the long side peripheral region.

16. The method as claimed in claim 14, wherein the light-shielding film is formed at the region of about 30~50% of the long side peripheral region, or the phase-reverse film is formed at the region of 50~70% of the long side peripheral region.

17. The method as claimed in claim 14, wherein the exposure region of the isolated pattern shape is rectangular.

18. The method as claimed in claim 17, wherein the short side length of the exposure region having the rectangular shape is patterned to have a width of 0.08~0.25 μm and the long side length of the exposure region is patterned to have a width of 0.35~0.45 μm.

19. The method as claimed in claim 14, wherein the phase-reverse film has a transmissivity of 5~30% and the phase of the light passed through the phase-reverse film is inverted.

* * * * *